(12) United States Patent
Yamazaki

(10) Patent No.: US 6,624,649 B2
(45) Date of Patent: Sep. 23, 2003

(54) PROBER AND LOW-TEMPERATURE TEST EQUIPMENT HAVING SAME INCORPORATED THEREIN

(75) Inventor: Hiroshi Yamazaki, Tokyo (JP)

(73) Assignee: Nagase Sangyo Kabushiki Kaisha, Osaka (JP)

( * ) Notice: Subject to any disclaimer, the term of this patent is extended or adjusted under 35 U.S.C. 154(b) by 0 days.

(21) Appl. No.: 09/823,797

(22) Filed: Mar. 30, 2001

(65) Prior Publication Data

US 2002/0008534 A1 Jan. 24, 2002

(30) Foreign Application Priority Data

Mar. 30, 2000 (JP) .......................... 2000-094091

(51) Int. Cl.$^7$ .............................................. G01R 1/073
(52) U.S. Cl. ........................................ 324/762; 324/760
(58) Field of Search ................................ 324/760, 754, 324/761, 762

(56) References Cited

U.S. PATENT DOCUMENTS 5,055,778 A * 10/1991 Okubo et al. ............... 324/762
6,298,312 B1 * 10/2001 Chen ........................... 324/761

* cited by examiner

Primary Examiner—Ernest Karlsen
(74) Attorney, Agent, or Firm—Steinberg & Raskin, P.C.

(57) ABSTRACT

A prober capable of enhancing accuracy of a test intended. The prober includes prober needles arranged so as to be kept contacted with a laminate formed by laminating thermal transfer regulating members on each other and provided on a probe card. Such arrangement of the laminate restrains heat of the probe card from being transmitted through the probe needles to devices on a semiconductor wafer which is a specimen to be tested.

7 Claims, 4 Drawing Sheets

PROBER AND LOW-TEMPERATURE TEST EQUIPMENT HAVING SAME INCORPORATED THEREIN

BACKGROUND OF THE INVENTION

This invention relates to a prober for testing electric characteristics of a cooled specimen or the like in a vacuum atmosphere and a low-temperature test equipment having such a prober incorporated therein, and more particularly to a prober suitable for use for a semiconductor wafer test equipment for testing a semiconductor wafer and a low-temperature test equipment having such a prober incorporated therein.

In recent years, it has been highly demanded that a semiconductor device is subjected to measurement of electric characteristics thereof or the like at an ultra-low temperature in a vacuum atmosphere for the purpose of ensuring reliable screening due to detection of an abnormal leakage current which fails to be detected in a room temperature, checking of operation of a low-temperature operation device such as a high-precision photo detector, a superconductive device or the like, measurement of physical characteristics of a device or pure wafer element at a low temperature by DLTS techniques or the like to measure various characteristics thereof such as a concentration of impurities therein, and the like.

For this purpose, a test equipment is proposed in the art which includes a vacuum chamber formed so as to be evacuated at a vacuum by means of a vacuum pump, a wafer holder arranged in the vacuum chamber, an ultra-low temperature refrigerator having a cooling head positioned in the vacuum chamber, and the like. Also, another test equipment is known in the art, as disclosed in Japanese Patent Application Laid-Open Publication No. 137547/1992. The test equipment includes a vacuum chamber, a spare chamber arranged adjacently to the vacuum chamber and configured so as to communicate through a gate valve with the vacuum chamber and temporarily store semiconductor wafers each of which is an object to be tested (tested object) therein. The test equipment is so constructed that the spare chamber is evacuated at a vacuum when the wafer is accessed to the vacuum chamber and the gate valve is closed to increase a pressure in only the spare chamber to an atmospheric level when the wafers each are removed from the spare chamber. This ensures that the vacuum chamber is constantly kept at a vacuum, to thereby successively subject the semiconductor wafers to a test under ultra-low temperature conditions.

The conventional test equipment described above generally has a prober which is constructed as shown in FIGS. 4 and 5 incorporated therein. More specifically, the prober generally designated at reference numeral 100 includes a probe card 101 constituted by a printed circuit board (PCB) formed into a substantially ring-like shape, a hole 101a defined by an inner peripheral edge of the probe card 101 and probe needles 102 arranged on the inner peripheral edge of the probe card 101 so as to inwardly extend therefrom or extend toward a center of the hole 101a. The probe needles 102, as shown in FIG. 5, each have a proximal end 102a fixedly supported on one surface of the probe card 101 by means of an adhesive and a distal end 102b arranged so as to extend toward the center of the hole 101a. Also, the prober 100 is securely arranged in a vacuum chamber (now shown) through an arm 103. The arm 103 may be supported so as to be longitudinally, laterally and/or vertically movable as required.

A specimen holder or semiconductor wafer holder 110 is controlled to permit the distal end 102b of each of the probe needles 102 to be contacted with an electrode of each of devices mounted on a specimen or semiconductor wafer supported on the semiconductor wafer holder 110, to thereby measure electric characteristics of the devices of the semiconductor wafer.

In order to more accurately measure electric characteristics of the devices mounted on the semiconductor wafer, it is desired to reduce transmission of heat from the prober 100 through the probe needles 102 to the devices as much as possible. Also, the probe needles 102 are mounted on the probe card 101 so as to be aligned with the electrodes of the devices on the semiconductor wafer. However, the low-temperature test causes heat shrinkage of the probe card 101, to thereby render positional registration or alignment of the probe needles 102 with the specimen difficult.

SUMMARY OF THE INVENTION

The present invention has been made in view of the foregoing disadvantage of the prior art.

Accordingly, it is an object of the present invention to provide a prober which is capable of reducing heat transmission from a probe card to a specimen to be tested (tested specimen) when it is subjected to a test under vacuum and low or ultra-low temperature conditions, to thereby enhance accuracy of the test.

It is another object of the present invention to provide a prober which is capable of absorbing thermal shrinkage of a probe card to facilitate positional registration or alignment between probe needles and a tested specimen while increasing accuracy of the alignment, to thereby further enhance accuracy of a test of the specimen.

It is a further object of the present invention to provide a prober which is capable of being suitable for a test of a semiconductor wafer.

It is still another object of the present invention to provide a low-temperature test equipment which is capable of reducing heat transmission from a prober to a tested specimen when it is subjected to a test under vacuum and low or ultra-low temperature conditions, to thereby enhance accuracy of the test.

It is yet another object of the present invention to provide a low-temperature test equipment which is capable of absorbing thermal shrinkage of a probe card to facilitate positional registration or alignment between probe needles and a tested specimen while increasing accuracy of the alignment, to thereby further enhance accuracy of a test for the specimen.

It is a still further object of the present invention to provide a low-temperature test equipment which is capable of being suitable for a test of a semiconductor wafer.

In accordance with one aspect of the present invention, a prober for a test of a specimen supported on a specimen holder cooled which is carried out in a vacuum chamber is provided. The prober includes a probe card formed into a substantially ring-like shape, at least one heat insulating member arranged on one surface of the probe card in a laminated manner or laminatedly so as to be positioned in proximity to an inner peripheral edge of the probe card, and probe needles each arranged in a manner to be contacted with the heat insulating member and having a distal end projected inwardly of the inner peripheral edge of the probe card.

In a preferred embodiment of the present invention, the heat insulating member is joined through an adhesive, such as an epoxy adhesive, to the one surface of the probe card.

In a preferred embodiment of the present invention, the thermal transfer regulating member is joined through an adhesive to the one surface of the probe card.

In a preferred embodiment of the present invention, a plurality of the heat insulating members are joined to each other by means of an adhesive, such as an epoxy adhesive, to thereby form a laminate.

In a preferred embodiment of the present invention, the heat insulating member is made of a ceramic material.

In a preferred embodiment of the present invention, the specimen is a semiconductor wafer and the specimen holder is a wafer holder, whereby the prober is used for a test of the semiconductor wafer supported on the wafer holder cooled which is carried out in the vacuum chamber.

In accordance with another aspect of the present invention, a low-temperature test equipment is provided. The low-temperature test equipment includes such a prober constructed as described above.

In a preferred embodiment of the low-temperature test equipment of the present invention, the specimen is a semiconductor wafer and the specimen holder is a wafer holder, whereby the prober is used for a test of the semiconductor wafer supported on the wafer holder cooled which is carried out in the vacuum chamber.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENT

Now, the present invention will be described hereinafter with reference to FIGS. 1 to 3(c).

Figure 1:
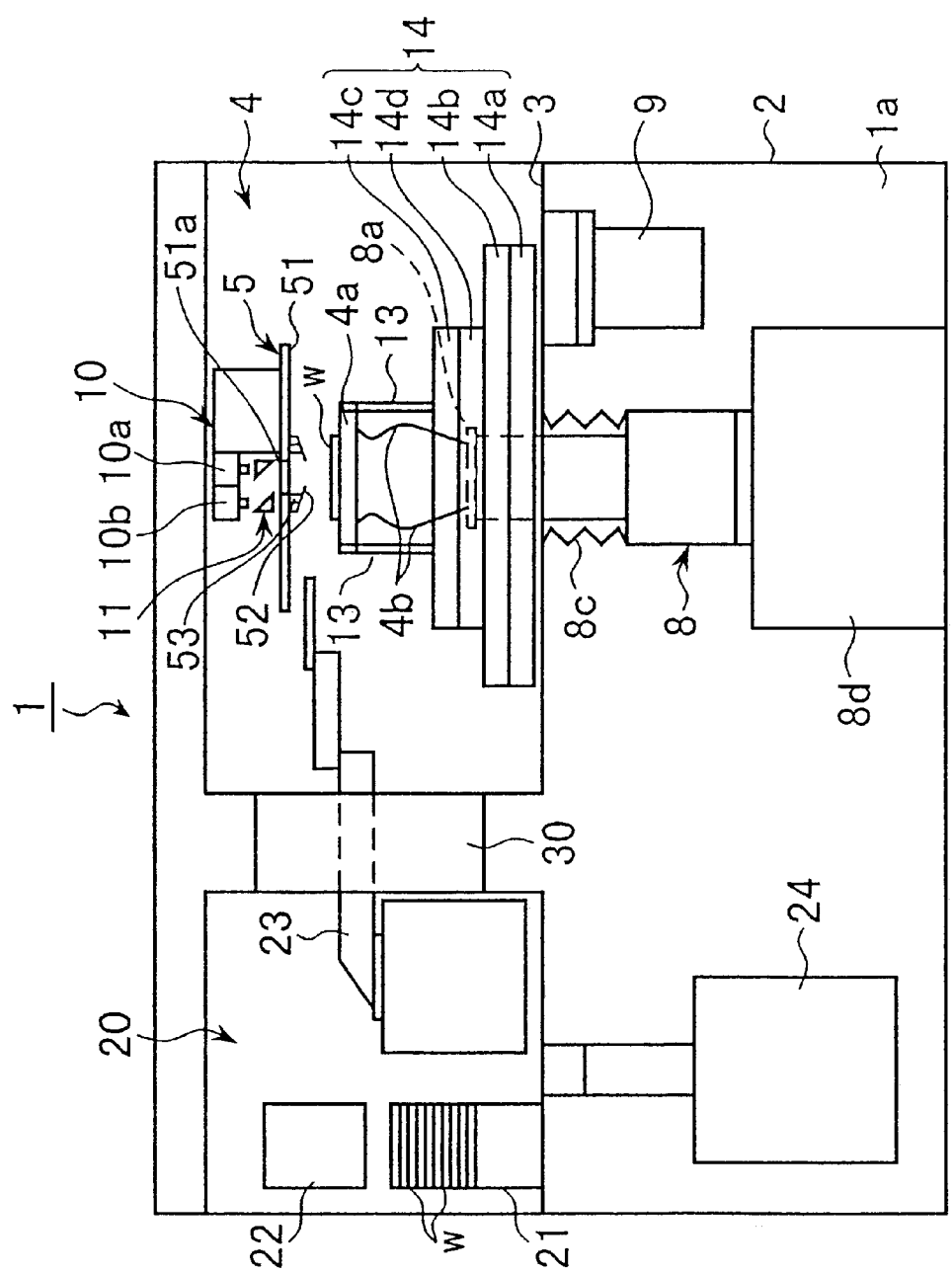
FIG. 1 is schematic view generally showing an embodiment of a low-temperature test equipment according to the present invention which is practiced in the form of a semiconductor wafer test equipment.

Referring first to FIG. 1, an embodiment of a low-temperature test equipment according to the present invention is illustrated, which is embodied in the form of a semiconductor wafer test equipment. A low-temperature test equipment or semiconductor wafer test equipment of the illustrated embodiment generally designated at reference numeral 1 includes a support frame 2 which is provided therein with an upper plate 3. Arrangement of the upper plate 3 in the support frame 2 permits a space 1a acting as a machine room to be defined below the upper plate 3 in the support frame 2. The test equipment 1 also includes a vacuum chamber 4 supported on the upper plate 3 in the support frame 2, a wafer holder 4a arranged in the vacuum chamber 4, a test prober 5 having a probe card 51 and probe needles 52 inserted into the vacuum chamber 4, a refrigerator 8 and a turbo pump 9 acting as a vacuum pump each arranged in the machine room 1a, an image-pickup or photographing unit 10, and a spare chamber 20 arranged in the support frame 2.

In the semiconductor wafer test equipment 1 thus generally constructed, the refrigerator 8 is provided at a top end thereof with a cooling head 8a and arranged in a manner to extend through a mounting hole formed via the upper plate 3 into the vacuum chamber 4 so that the cooling head 8a is positioned in the vacuum chamber 4. The wafer holder 4a is arranged so as to enable a specimen or semiconductor wafer W which is an object to be tested (tested object) to be held thereon. The cooling head 8a and wafer holder 4a are connected through heat transfer mediums 4b to each other.

More specifically, the vacuum chamber 4 is configured into a box-like shape and constructed in an airtight manner. The vacuum chamber 4 is evacuated at a predetermined pressure or vacuum by actuation of the turbo pump 9. Also, the vacuum chamber 4 is provided on one of side walls thereof with an openable gate valve 30 which permits the semiconductor wafer W to be selectively accessed to the vacuum chamber therethrough.

The refrigerator 8 includes a compressor and the like in addition to the above-described cooling head 8a and may be constructed in a manner to be conventionally known in the art so long as it permits the vacuum chamber 4 to be cooled to a low temperature or an ultra-low temperature. For example, a refrigerator which uses helium, liquid nitrogen, alternate flon or the like as a refrigerant may be used for this purpose. Between the refrigerator 8 and the upper frame 3 is arranged a bellows 8c in a manner to be connected therebetween, so that it may absorb vibration of the refrigerator 8. Below the refrigerator 8 is positioned a weight member 8d in a manner to be integrally connected thereto. The weight member 8d acts to hold the refrigerator 8 as immovable as possible, resulting in functioning as a vibration restraining means.

The wafer holder 4a arranged above the cooling head 8a in the vacuum chamber 4 is made of, for example, a copper plate and supported on four rods 13. The rods 13 each are arranged on a transfer stage structure 14 constructed so as to be movable in three-dimensional directions. More specifically, the transfer stage structure 14 includes an X-stage 14a movable in a longitudinal direction, a Y-stage 14b movable in a lateral direction and a Z-stage 14c movable in a vertical direction. The transfer stage structure 14 further includes a θ-stage 14d for rotatably supporting the Z-stage 14c. Operation of the stages permits the wafer holder 4b to be transferred in the vertical, lateral and longitudinal directions. The rods 13 each may be constituted by a tube made of a material such as, for example, ceramic, stainless steel or the like in order to minimize or substantially restrain transmission of heat generated from the transfer stage structure 14 to the wafer holder 4a.

The wafer holder 4a, as described above, is connected to the cooling head 8a through the heat transfer mediums 4b. The heat transfer mediums 4b each may be made of, for example, a copper wire or constituted by a so-called copper twisted member formed by twisting a plurality of copper wires together. Alternatively, the mediums 4b each may be constituted by a net member such as a copper net member formed of copper wires or the like. The heat transfer mediums 4b thus constructed function to transmit heat from the cooling head 8a therethrough to the wafer holder 4a. Formation of copper wires or the like into the heat transfer mediums 4b permits them to absorb vibration of the refrigerator 8 together with the bellows 14.

Figure 3:
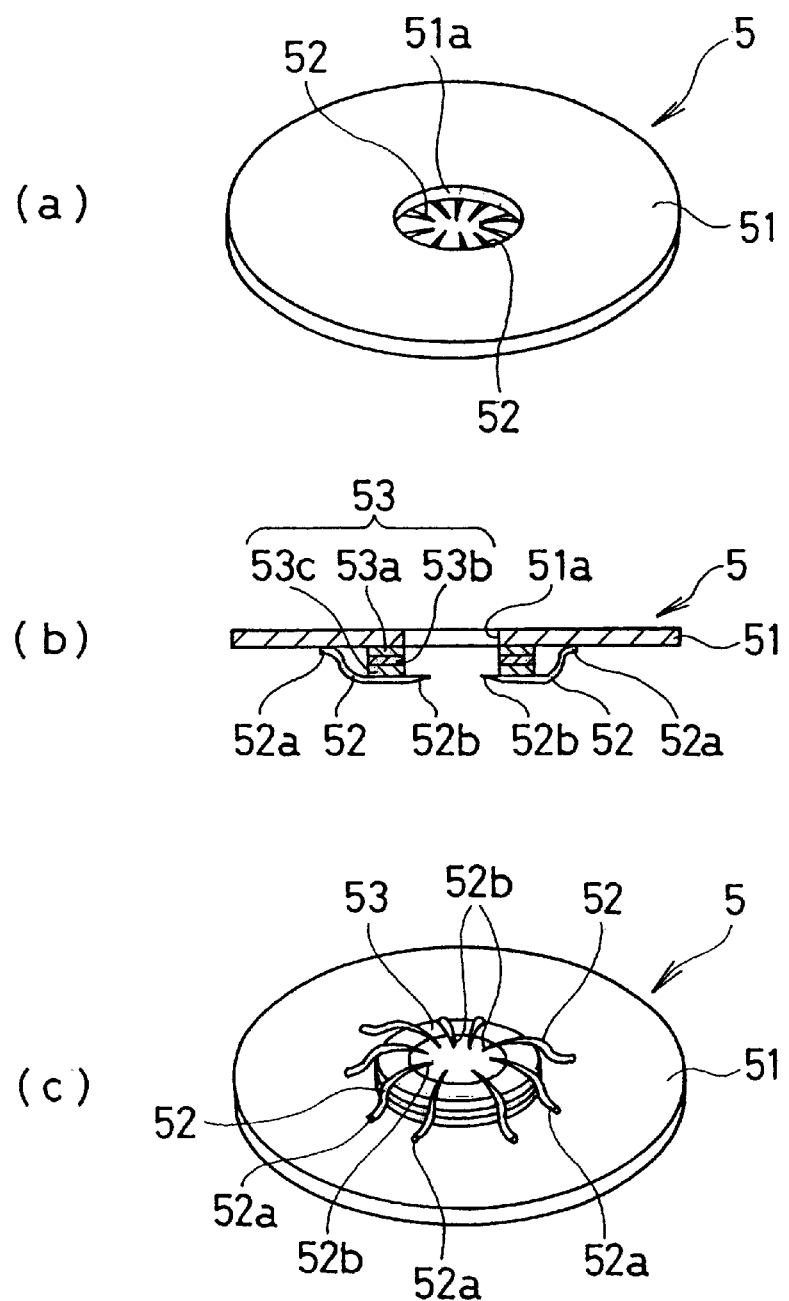
FIG. 3(a) is a perspective view showing an upper side of a prober according to the present invention which is incorporated in the semiconductor wafer test equipment shown in FIG. 1.
FIG. 3(b) is a sectional view of the prober shown in FIG. 3(a)
FIG. 3(c) is a perspective view showing a lower side of the prober shown in FIG. 3(a)
Figure 4:
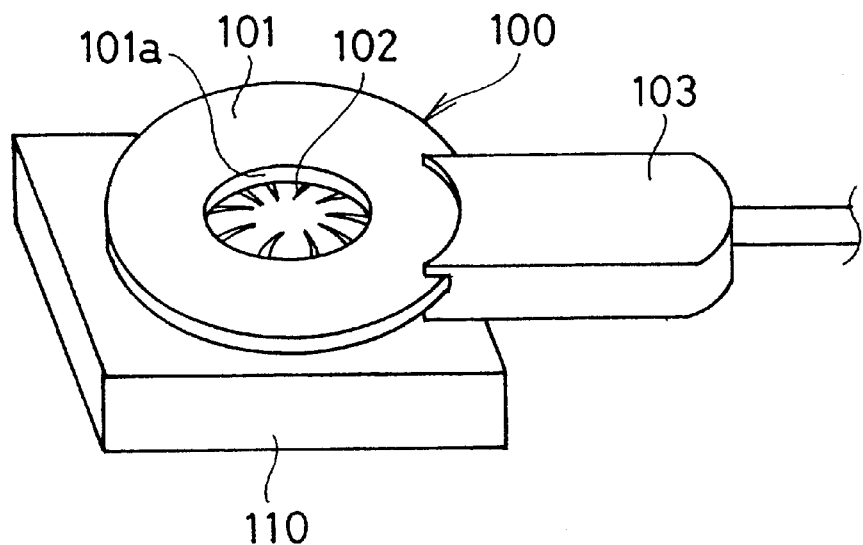
FIG. 4 is a perspective view showing a conventional prober.
Figure 5:
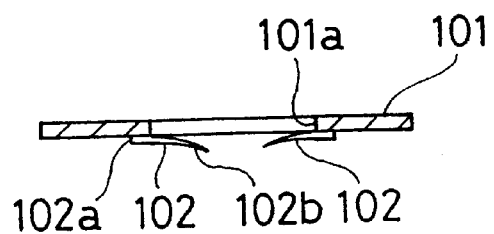
FIG. 5 is a sectional view of the conventional prober shown in FIG. 4.

The prober 5, as shown in FIGS. 1 and 3, includes a heat insulating means which may be a laminate 53 constituted by a plurality of heat insulating members 53a to 53c laminated n each other, in addition to the probe card 51 and probe needles 52 described above. Alternatively, the heat insulating means may be constituted by only one heat insulating member rather than the laminate 53. The probe card 51 is constituted by a printed circuit board (PCB) formed into a substantially ring-like configuration having outer and inner peripheral edges and has a hole 51a defined by the inner peripheral edge thereof. Also, the illustrated embodiment may be so constructed that heat of the cooling head 8a is transmitted through the heat transfer mediums 4b to the probe 5, to thereby cool the probe 5.

The laminate 53 constituted by the heat insulating members 53a to 53c is formed into a substantially ring-like shape of which an inner diameter substantially identical with a diameter of the hold 51a of the probe card 51. The laminate 53 is securely mounted on one surface of the probe card 51 in a manner to be positioned rather in proximity to the inner peripheral edge of the probe card 51 defining the hole 51a. In the illustrated embodiment, it may be substantially aligned with the hole 51a. The laminate 53 thus constructed functions to restrain heat of the probe card 51 frm being transmitted through the probe needles 52 to devices on the semiconductor wafer W which is a specimen. The laminate 53 is not limited to any specific material so long as it exhibits increased heat insulating properties. For example, a ceramic material such as silica, alumina or the like may be used for this purpose.

The ceramic material is reduced in thermal expansion coefficient, to thereby be reduced in heat shrinkage due to cooling. Also, the semiconductor wafer W is likewise made of a ceramic material such as silica ($SiO_2$) or the like, to thereby have a thermal expansion coefficient approaching to the above-described ceramic material, resulting in deviation between a position of the probe needles 52 and that of the electrodes on the semiconductor wafer W being minimized. Thus, arrangement of the probe needles 52 while being joined to the laminate 53 and joining between the probe card 51 and the laminate 53 by means of an adhesive permit a difference in thermal expansion coefficient between the probe card 51 and the laminate 53 to be absorbed by the adhesive, such as an epoxy adhesive or the like to thereby prevent positional deviation or misregistration of the probe needles 52 with respect to the semiconductor wafer W.

The laminate 53, as described above, is formed by laminating the plural heat insulating members 53a to 53c on each other by means of an adhesive. Such construction of the laminate 53 permits a difference in thermal expansion coefficient between the probe card 51 and the heat insulating members 53a to 53c when heat shrinkage occurs due to cooling to be effectively absorbed by layers of the adhesive interposed among the heat insulating members 53a to 53c. Thus, one such heat insulating member in the form of a single layer may be used for this purpose, however, the above-described construction of the illustrated embodiment wherein the plural heat insulating members 53a to 53c are laminated on each other through the adhesive layers to form the laminate 53 is preferable because it effectively prevents misregistration of the probe needles 52 with respect to the semiconductor wafer W.

The probe needles 52 each are supported on a surface of the laminate 53 while being kept contacted therewith. Also, the probe needles each have a distal end 52b projected inwardly of the inner peripheral edge of the probe card 51 or extending toward a center of the hole 51a of the probe card 51. The above-described arrangement of the probe needles 52 in a manner to be contacted with the surface of the laminate 53 minimizes thermal transfer from the probe card 51 thereto, to thereby keep the probe needles 52 maintained at an original or initial position defined during design thereof.

In order to ensure positive support of the probe needles 52, the probe needles 52 each preferably have a proximal end 52a fixed on the probe card 51 by means of an adhesive or the like and an intermediate portion joined to the surface of the laminate 53 by means of an adhesive or the like. In such arrangement of the probe needles 52, it is required to increase a whole length of each of the probe needles 52 from the proximal end 52a to the distal end 52b as compared with the prior art when a distance by which the distal end 52b is projected into the hole 51a is set to be the same as in the prior art. An increase in whole length of the probe needle 52 permits thermal transfer from the probe card 51 through the probe needle 52 to be further restrained, therefore, the probe needles 52 are preferably arranged as shown in FIG. 3.

The prober 5 may be supported through an arm for holding the probe card 51 on an actuation mechanism or a transfer stage structure (not shown) including stages arranged so as to be movable in X-Y-Z directions or longitudinal, lateral and vertical directions, as well as in a θ direction or rotational direction if required, as in the prior art.

Further, the semiconductor wafer test equipment 1 of the illustrated embodiment, as shown in FIG. 1, includes a photographing or image pickup unit 10 including two CCD cameras 10a and 10b each acting as a photographing or image pickup means. The CCD cameras 10a and 10b are operated in a vacuum atmosphere, resulting in being provided with no zoom mechanism. Thus, they each have a photographing magnification and a visual field fixed. However, the CCD cameras 10a and 10b are provided with a prism mechanism 11 in a manner to be positioned therebelow, so that the semiconductor wafer W and/or probe needles 52 may be photographed through the hole 51a of the probe card 51 by any of the CCD cameras 10a and 10b. Also, one of the cameras which is designated at reference numeral 10a acts to confirm a position of the distal end of each of the probe needles 52 or a contact position thereof with respect to the semiconductor wafer W and the other camera 10b is used for analyzing an image of a surface of the semiconductor wafer W. More specifically, the one CCD camera 10a is used for confirmation of a position of the distal end of the probe 10b or a contact position thereof with respect to the semiconductor wafer W, so that it is set at a high magnification and a narrow visual field relatively to the other CCD camera 10b. Also, the other CCD camera 10b is used for image-analysis of the surface of the semiconductor wafer W, therefore, it is set at a low magnification and a wide visual field as compared with the CCD camera 10a.

The CCD cameras 10a and 10b described above are supported on a transfer stage structure (not shown) which is constructed in a manner to be movable in three-dimensional directions and includes an X-stage arranged so as to be movable in a longitudinal direction, a Y-stage movable in a lateral direction and a Z-stage 10e movable in a vertical direction, so that a position at which the CCD cameras 10a and 10b carry out photographing may be adjusted as desired.

The semiconductor wafer test equipment 1 of the illustrated embodiment, as shown in FIG. 1, includes the spare chamber 20 arranged adjacently to the vacuum chamber 4 and connected through the gate valve 30 thereto. In the semiconductor wafer test equipment 1 of the illustrated embodiment, the spare chamber 20 has a plurality of the tested specimens or semiconductor wafers W received therein. The spare chamber 20 is constructed so as to communicate with an atmosphere during operation of receiving the semiconductor wafers therein and be kept at a vacuum during feeding of the semiconductor wafers W to the vacuum chamber 4, to thereby ensure that the semiconductor wafers W are successively subjected to a test intended.

More specifically, the spare chamber 20 is provided therein with a cassette stage 21 for holding the plural semiconductor wafers W thereon, a pre-alignment unit 22 and a robot arm 23. The semiconductor wafers W held on the cassette stage 21 are transferred to the pre-alignment unit 22 one by one and aligned together thereon. Then, the gate valve 30 is rendered open and the robot arm 23 is extended into the vacuum chamber 4 to transfer the semiconductor wafer W onto the wafer holder 4a. Also, the spare chamber 20 has a rotary pump 24 which acts as a vacuum pump connected thereto. Thus, when the gate valve 30 is open to carry out delivery of the semiconductor wafer W between the cassette stage 21 and the wafer holder 4a by means of the robot arm 23, the rotary pump 24 is activated to form a vacuum atmosphere in the spare chamber 20. This results in a vacuum being constantly kept in the vacuum chamber 4, to thereby ensure that the semiconductor wafers W may be successively subjected to an intended test.

Figure 2:
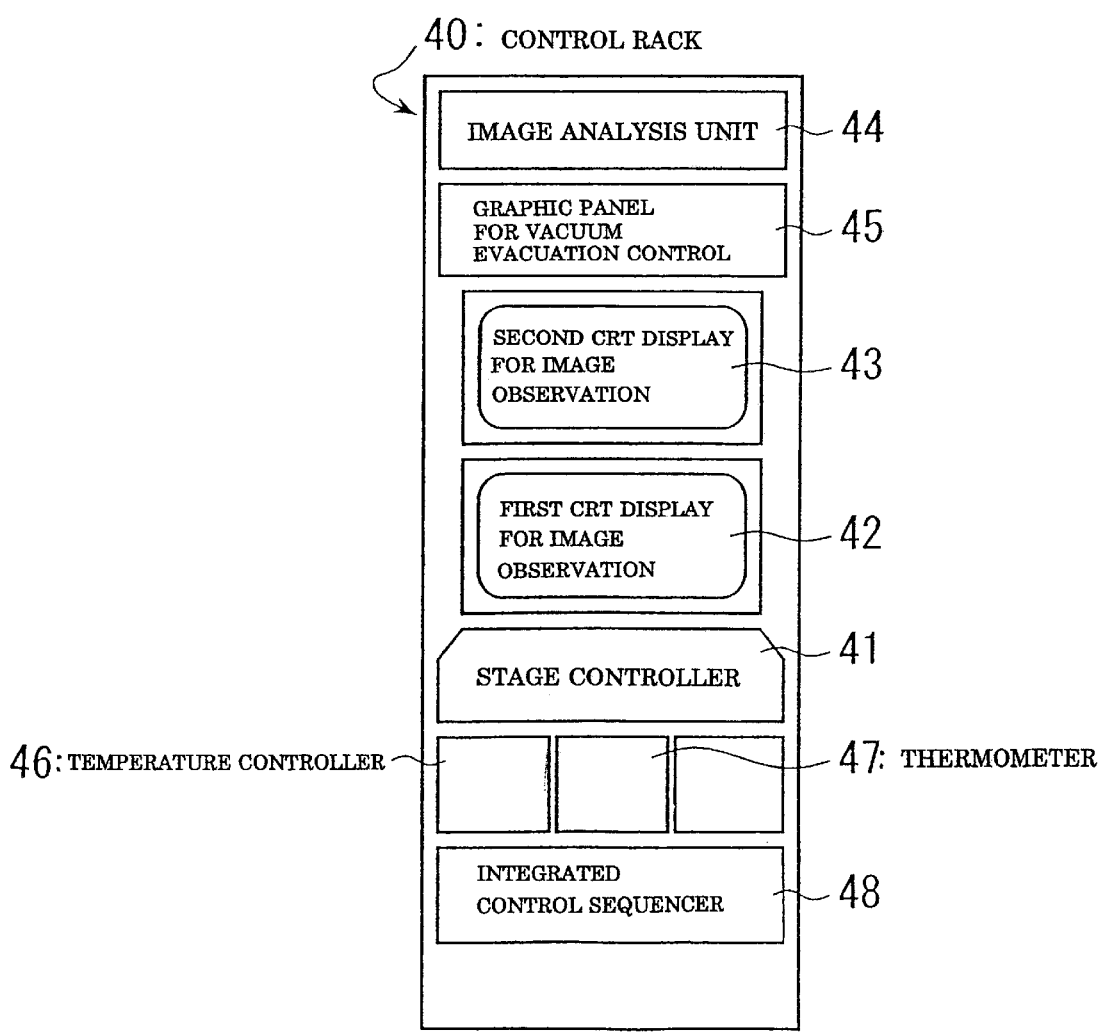
FIG. 2 is a block diagram schematically showing a control rack for controlling operation of the semiconductor wafer test equipment shown in FIG. 1.

Referring now to FIG. 2, a control rack in which a control section of the semiconductor wafer test equipment 1 of the illustrated embodiment and the like are arranged is illustrated. The control rack generally designated at reference numeral 40 includes a stage controller 41 for controlling each of the transfer stage structure 14 for the wafer holder 4a and the transfer stage structure provided on the image pickup unit 10, a CRT display 42 for image observation which functions to display an image picked up by the CCD camera 10a, a second CRT display 43 for image observation which functions to display an image picked up by the CCD camera 10b, an image analysis unit 44 for analyzing images picked up by the CCD cameras 10a and 10b, a graphic panel 45 for control of vacuum evacuation which functions to control actuation of the turbo pump 9 and rotary pump 24, a temperature controller 46, a thermometer 47, and an integrated control sequencer 48 for integrally controlling the above-described components 41 to 47.

In the illustrated embodiment, the transfer stage structure 14 is controlled to suitably move the wafer holder 4a in the X-direction, Y-direction and/or Z-direction as desired, to thereby positionally align the distal ends 52b of the prober needles 52 with electrodes of devices formed on the semiconductor wafer W held on the wafer holder 4a while being cooled in the vacuum chamber 4, resulting in semiconductor wafer W being subjected to a test for measurement of electric characteristics thereof or the like. In this instance, the probe needles 52 are kept contacted with the laminate 53 constituted by the heat insulating members 53a to 53c made of a material reduced in thermal conductivity and increased in specific heat as compared with the PCB and mounted on the probe card 51, resulting in being kept cooled due to contract with the semiconductor wafer W cooled. This prevents an increase in temperature of the probe needles 52 during the subsequent tests carried out while being kept contacted with the semiconductor wafer, to thereby restrain heat of the probe card 51 from being transmitted through the probe needles 52 to the devices on the semiconductor wafer W. This results in the test being attained at increased accuracy. Also, the semiconductor wafer W as well is made of a ceramic material such as silica ($SiO_2$) or the like, to thereby have a thermal expansion coefficient similar to that of the laminate 53, so that deviation between a position of the probe needles 52 and a position of electrodes on the semiconductor wafer W may be minimized.

In particular, the illustrated embodiment is so constructed that the laminate 53 is joined to the probe card 51 through the adhesive layer and the laminate per se is constituted by the plural heat insulating members 53a to 53c joined to each other by means of the adhesive layers. Such construction permits the adhesive layers to absorb a difference in heat shrinkage between the probe card 51 and the heat insulating members 53a to 53c. This restrains a position of the distal end 52b of each of the probe needles 52 from being deviated from an original or initial position determined during design thereof, leading to an increase in accuracy of a test of the semiconductor wafer W.

Also, the illustrated embodiment permits analysis of an image of the surface of the semiconductor wafer W and confirmation of a position of the distal end of each of the probe needles 10b or a contact position thereof with respect to the semiconductor wafer W by both CCD cameras 10a and 10b acting as the photographing means to be displayed on the first CRT display 42 and second CRT display 43, respectively. Thus, the illustrated embodiment enables operation of positionally aligning the probe needles 52 and semiconductor wafer W with each other to be accurately carried out because the transfer stage mechanism 14 for the wafer holder 4a can be moved while monitoring the operation on the CRT displays 42 and 43.

Further, the illustrated embodiment, as described above, permits operation of positionally aligning the probe needles 52 and semiconductor wafer W with each other to be accurately carried out. Thus, the illustrated embodiment may be constructed so that the stage controller 41 for controlling the transfer stage mechanism 14 for the wafer holder 4a is fed with a predetermined electric signal based on data obtained by subjecting results of the monitoring to processing. This permits the transfer stages of the transfer stage mechanism 14 to be automatically controlled. Thus, the continuous-type test equipment of the illustrated embodiment including the spare chamber 20 which is constructed so as to successively feed the semiconductor wafers W to the vacuum chamber realizes full automation of the test irrespective of the fact that the test is carried out under vacuum and low or ultra-low temperature conditions.

As can be seen from the foregoing, the probe of the present invention is so constructed that the probe card is provided thereon with at least one heat insulating member and the probe needles are supported on the heat insulating member while being kept contacted therewith. Such construction significantly reduces thermal transfer from the probe card through the probe needles to a tested specimen such as a semiconductor wafer or the like during a test of the specimen under vacuum and low or ultra-low temperature conditions. Also, one such heat insulating member is joined to the probe card through the adhesive layer or a plurality of the heat insulating members are joined in the form of the laminate to the probe card through the adhesive layers. This permits heat shrinkage of the probe card to be absorbed by the adhesive layers, resulting in positional registration or alignment between the probe needles and the specimen being readily and accurately attained, leading to an increase in accuracy of the test.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A prober for a test of a specimen supported on a cooled specimen holder which is carried out in a vacuum chamber, comprising:

a probe card formed into a substantially ring-like shape;

a plurality of heat insulating members;

at least one of said plurality of heat insulating members laminated on to one surface of said probe card so as to be positioned in proximity to an inner peripheral edge of said probe card; and a plurality of probe needles each structured and arranged in a manner to be in contact with said at least one of said plurality of heat insulating members and having a distal end projecting inwardly of said inner peripheral edge of said probe card;

wherein each of said plurality of probe needles has a proximal end supported on said one surface of said probe card;

wherein at least one of said heat insulating members is attached to said one surface of said probe card by an adhesive; and wherein said plurality of heat insulating members are joined to each other by means of an adhesive, to thereby form a laminate.

2. A prober as defined in claim 1, wherein said plurality of heat insulating members are made of a ceramic material.

3. A prober as defined in claim 1, wherein said specimen is a semiconductor wafer and said specimen holder is a wafer holder, whereby the prober is used for a test of the semiconductor wafer supported on a cooled wafer holder and is carried out in the vacuum chamber.

4. A prober as defined in claim 1, wherein said adhesive is an epoxy adhesive.

5. The prober as defined in claim 1, wherein each of said plurality of probe needles is structured and arranged such that an intermediate portion of said probe needle, between said proximal end and said distal end, is in contact with at least one of said heat insulating members.

6. A low-temperature test equipment comprising:

a prober having;

a plurality of heat insulating members;

a probe card formed into a substantially ring-like shape;

at least one of said plurality of heat insulating members laminated onto one surface of said probe card so as to be positioned in proximity to an inner peripheral edge of said probe card, wherein said at least one of heat insulating members are joined to each other by means of an adhesive to thereby form the laminate; and a plurality of probe needles each structured and arranged in a manner to be in contact with at least one of said heat insulating members and having a distal end projecting inwardly of said inner peripheral edge of said probe card.

7. A low-temperature test equipment as defined in claim 6, wherein said specimen is a semiconductor wafer and said specimen holder is a wafer holder;

whereby the prober is used for a test of the semiconductor wafer supported on a cooled wafer holder and which is carried out in the vacuum chamber.

* * * * *